United States Patent [19]
Rostek

[11] 3,969,572
[45] July 13, 1976

[54] ELECTROMAGNETIC INTERFERENCE SHIELDING GASKET FOR LIGHT-WEIGHT EQUIPMENT ENCLOSURES

[75] Inventor: Paul M. Rostek, San Diego, Calif.

[73] Assignee: NCR Corporation, Dayton, Ohio

[22] Filed: Mar. 5, 1975

[21] Appl. No.: 555,519

[52] U.S. Cl. .................. 174/35 MS; 174/35 GC; 277/235 R
[51] Int. Cl.² ........................................ H05K 9/00
[58] Field of Search .................. 174/35 GC, 35 MS; 210/10.55 D; 277/235 R, 234

[56] References Cited
UNITED STATES PATENTS

| | | | |
|---|---|---|---|
| 2,338,031 | 12/1943 | Ellenwood | 174/40 CC |
| 2,469,474 | 5/1949 | Perry | 174/35 GC |
| 2,923,760 | 2/1960 | Famely | 174/40 CC |
| 3,260,788 | 7/1966 | Stetson | 174/35 GC |
| 3,889,043 | 6/1975 | Ducros | 174/35 GC |

FOREIGN PATENTS OR APPLICATIONS

| | | | |
|---|---|---|---|
| 936,639 | 12/1955 | Germany | 174/35 GC |

*Primary Examiner*—Darrell L. Clay
*Attorney, Agent, or Firm*—J. T. Cavender; James H. Phillips

[57] ABSTRACT

A low-cost electromagnetic interference (EMI) gasket for light-weight equipment enclosures. A pliable strip of electrically conductive material is wrapped spirally about a flexible laminar core structure comprising foam and permanent magnet elements. The gasket is emplaced between two conductive surfaces forming portions of an EMI shield, one of which surfaces is attractive to the magnet element of the gasket.

4 Claims, 5 Drawing Figures

ELECTROMAGNETIC INTERFERENCE SHIELDING GASKET FOR LIGHT-WEIGHT EQUIPMENT ENCLOSURES

BACKGROUND OF THE INVENTION

1. Field of the Invention:

This invention relates to anti-inductive structures, and more particularly to a light-weight gasket for use as an EMI seal.

The design of electronic equipment cabinets, particularly cabinets housing computer and other commercial equipment operating in a controlled environment, has moved in recent times toward the use of lighter weight structures. The use of structural foam and composition board for panels and doors is one example of this trend. EMI shielding for such structures must of course undergo a commensurate decrease in weight, without reduced performance.

The EMI shields of equipment enclosures exhibit discontinuities at covers, doors, panels, ventilating openings and the like. One of the most important elements of the EMI shield is the gasket means utilized for "sealing" the discontinuities to prevent undesirable EMI leakage. Such seals usually take the form of electrical conductors bridging or short circuiting the discontinuities.

2. Description of the Prior Art

Prior art EMI seals or gaskets consist of spring-tempered metal (e.g., brass, Phosphor-bronze, beryllium-copper or the like) usually formed into a plurality of bridging conductors termed finger stock or coil stock. Spring-tempered metal gaskets require substantial pressure exerted thereon in order to establish reliable electrical contact between the elements of an EMI shield, through the fingers or coils interposed between the elements. Such pressure was readily supplied by the latching or dogging of relatively heavy closures. Further, it was often necessary to support or attach elements of the gasket to the enclosure by means of heavy metal support bars or clamps and the attendant fastening hardware.

With the advent of light weight enclosure elements there arises a need for a light-weight reliable EMI gasket.

SUMMARY OF THE INVENTION

Accordingly, it is a primary object of my invention to provide an improved electromagnetic interference seal for electronic equipment enclosures.

It is a more particular object of my invention to provide an improved EMI gasket of substantially reduced weight.

It is another object of my invention to provide an improved EMI gasket which is easily installed without heavy support or attachment hardware.

It is a further object of my invention to provide an improved low-cost EMI gasket which is easily and economically assembled from standard, purchasable materials, and is installed with a reduced number of labor-dependent steps to a light-weight equipment enclosure.

These and other objects are achieved in accordance with the invention claimed by providing an EMI gasket in the form of an elongated flexible strip assembled by first forming a laminar core from adjacent strips of plastic foam and flexible plastic permanent magnet. A strip of electrically conductive metal is then wrapped spirally about the core partially compressing the foam, the foam and the spirally wrapped strip cooperating to hold together the assembled gasket. The foam side of the flexible strip is then bonded to one of two opposed surfaces about the periphery of an opening in an EMI shielded enclosure, which surfaces form part of the shield, the coils of the spirally wrapped strip establishing electrical contact with the surface to which the gasket is bonded. The surface of the shield opposing the bonding surface includes a magnetic material attractive to the facing magnet. When the opposing surfaces are brought together (i.e., when the door is closed) the permanent magnet latches to the magnetic material establishing electrical contact between the shield and the coils of the spirally wrapped metal strip interposed therebetween, thereby bridging the electrical discontinuity between the two opposed shield surfaces. In another embodiment of the gasket, the plastic foam strip is sandwiched between the plastic magnet and another strip of conductive metal.

BRIEF DESCRIPTION OF THE DRAWINGS

The invention is pointed out with particularity in the appended claims; however, other objects and features of my invention will become more apparent and the invention itself will best be understood by referring to the following description and embodiments taken in conjunction with the accompanying drawings, in which:

DESCRIPTION OF THE PREFERRED EMBODIMENT

Figure 1:
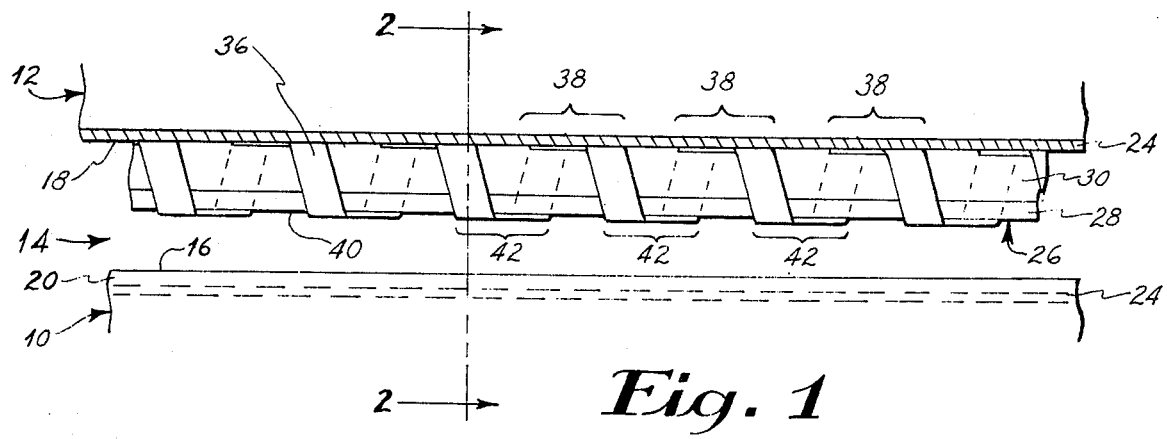
FIG. 1 is a side elevation of a spiral magnetic EMI gasket interposed between the elements of an equipment enclosure.
Figure 2:
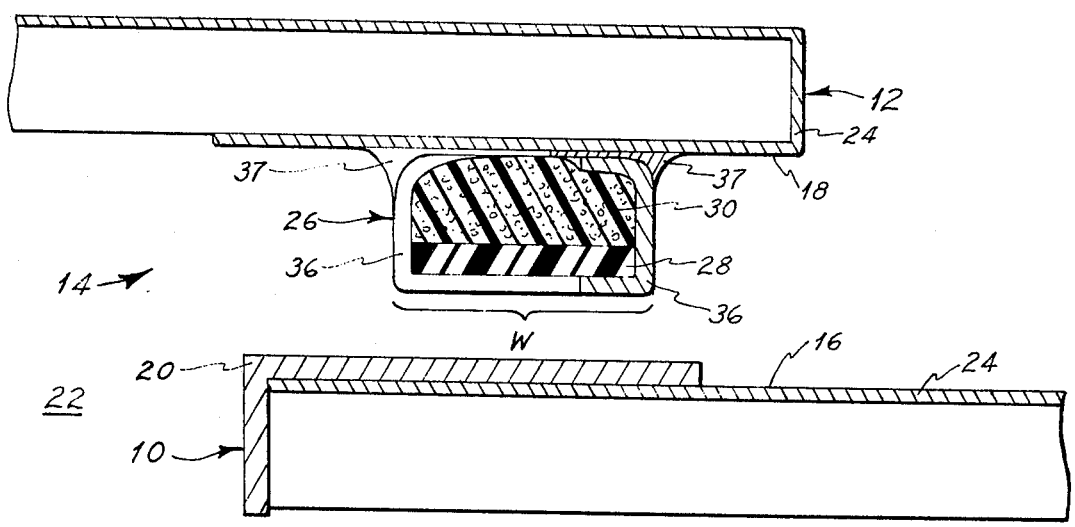
FIG. 2 is a section taken along lines 2—2 of FIG. 1.

Referring now to the various views of the drawing by characters of reference, the invention is illustrated in FIGS. 1 and 2 as applied to a junction of a pair of members 10, 12 of an equipment enclosure 14, between opposed surfaces 16, 18 thereof. In a preferred embodiment the enclosure 14 comprises a body member 10 and panel member 12 of light-weight material such as structural foam or composition board. One of the pair of members 10, 12 includes an edge member 20 of magnetic material disposed around the periphery of an opening in the enclosure, which opening is designated as a general area in FIG. 2 by the reference number 22. In a light-weight enclosure such as that contemplated in the preferred embodiment of my invention, the edge member 20 may serve to protect the structural foam at the edges thereof where it is susceptible to impact damage. The edge member 20 may also be formed to serve as an attachment bracket (e.g. receiving an access door) or a door handle. Alternatively, the edge member may constitute a portion of the structural frame of the enclosure 14. Openings in the enclosure 14 such as the opening 22 serve as access ports for operation or maintenance of the enclosed equipment, or as ventilating or viewing ports. The panel member 12 covering the opening 22 may be a removable panel having separate attaching means (not shown) or a hinged closure.

Figure 3:
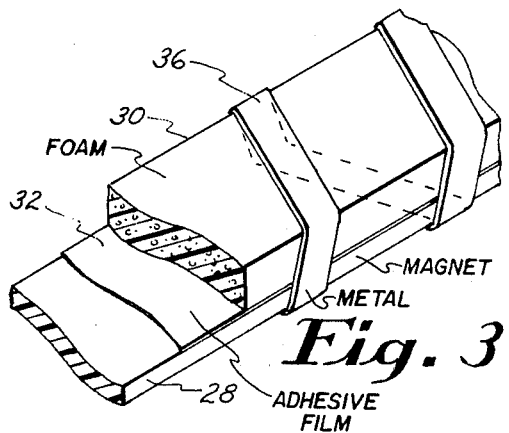
FIG. 3 is a cutaway isometric view of one embodiment of the gasket.
Figure 4:
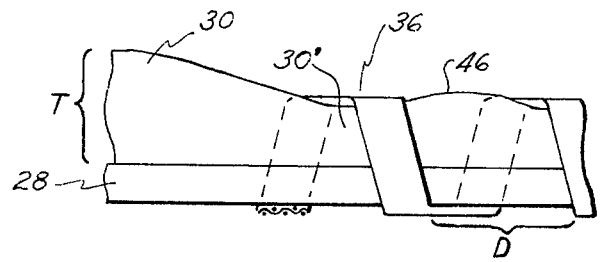
FIGS. 4 and 5 are alternate embodiments of the gasket.
Figure 5:
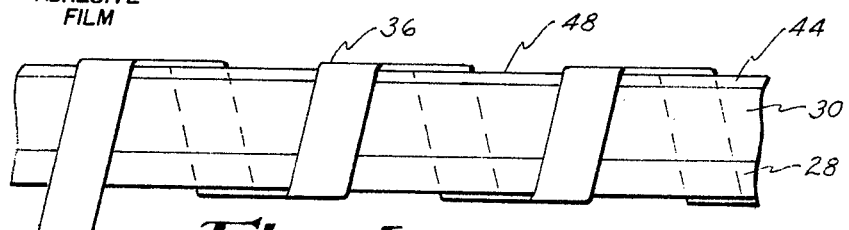

The enclosure 14 includes a circumambient electromagnetic interference (EMI) shield 24 comprising a conductive membrane of metal foil such as copper on one or both faces of the enclosure members 10, 12. The edge member 20 is electrically connected to and forms a part of the shield 24. At the edges of the ports and openings such as the opening 22, the EMI shield 24 necessarily exhibits discontinuities resulting in EMI leakage. An EMI gasket 26 is provided for bridging the discontinuities of the shield 24 at the junction of the panel members 10, 12. Referring to FIGS. 3–5, one embodiment of the gasket 26 includes a core comprising a magnetic element 28 and a strip of flexible plastic foam 30. The magnetic element 28 is preferably a flexible plastic permanent magnet in strip form, such as are available from Bunting Magnetics Co., Franklin Park, Illinois. The flexible foam strip 30 is preferably polyurethane and may be bonded to the magnetic strip 28 by an adhesive film 32. Magnetic strips and foam strips having adhesive layers such as the film 32 on one face thereof are available commercially; however it should be understood that adhesive bonding of the foam and magnetic strips is not necessary for the practice of my invention.

The magnetic and foam strips 28, 30 bonded together or simply abutting one another form a core or laminar strip 34. A strip 36 of pliable conductive metal, typically 0.152 mm thick copper foil, is wrapped spirally about the laminar strip 34 compressing the foam 30 to a thickness ⅔ to ⅓ the original uncompressed thickness T of the foam 30, as illustrated in FIG. 4. The partially compressed foam 30' retains sufficient resiliency to allow the gasket to conform flexibly to the surface irregularities of the enclosure members, while at the same time, in cooperation with the spirally wrapped strip 36, providing support for the magnetic element 28.

Referring now to FIG. 1, the gasket 26 is bonded to one of the members 10, 12 of the enclosure 14; in the embodiment illustrated, to the panel member 12. The bonding is accomplished utilizing conductive adhesive 37 at spaced-apart areas 38 which preferably touch the coils of the spirally wrapped strip 36, thereby establishing electrical contact between the strip 36 and the shield 24. When thus bonded, the exposed face 40 of the magnet 28 on the opposite side of the gasket 26 from the bonding areas 38 is presented to the magnetic material 20 on the opposing face 16 of the body member 10. When the magnet 28 and the magnetic material 20 are brought together by closing the pair of members 10, 12, the forces exerted between the mutually attractive elements 20, 28, hold the members 10, 12 together. The portions 42 of the conductive strip 36 interposed between the magnet 28 and the surface 16 establish electrical contact with the conductive material 20, thus bridging the discontinuity in the shield 24 at each of the contact area pairs 38, 42.

FIG. 5 illustrates an alternate embodiment of my invention wherein the foam strip 30 is sandwiched between the plastic magnet 28 and a strip 44 of conductive metal such as copper foil. I have found that when the distance D between the adjacent coils of the spirally wrapped strip 36 is sufficiently large to allow the foam 30 to form a pronounced bulge 46 (FIG. 4) between the coils, the bulge 46 may cause difficulty in establishing electrical contact between the strip 36 and the surface to which the gasket is bonded. The bulge 46 may be reduced to a size which has negligible effect on the bonding operation by reducing the distance D. The bulge may be eliminated by reducing the distance D to an amount which results in uniform compression of the foam with respect to the longitudinal dimension or length thereof. Alternatively, the additional strip 44 of copper foil may be utilized to reduce or eliminate the bulge 46.

The distance D may also be reduced to zero (or even a negative value if an extremely thin metal foil strip 36, e.g. less than 0.1 mm, is utilized) thus producing contiguous coils of the spirally wrapped strip 36. Contiguous or overlapping coils are not, however, preferred, distances D equal to or greater than the width W of the gasket having proved to be efficacious.

Metal foil having a conductive adhesive film on one surface thereof (such as the surface 48 of FIG. 5) may be utilized to further reduce the labor required for bonding the gasket 26 to the enclosure 14 by eliminating the step of applying conductive adhesive to the gasket as previously described with reference to FIGS. 1 and 2.

The present invention includes within its scope a light-weight structure wherein a closure having my gasket bonded thereto needs no attaching means other than the gasket 26 itself attracted and held to the magnetic material 20 disposed about the periphery of the opening 22.

While the principles of my invention have been made clear in the foregoing description, it will be immediately obvious to those skilled in the art that many modifications of the structure, arrangement, proportion, the elements, material and components may be used in the practice of the invention which are particularly adapted for specific environments without departing from those principles. One such modification utilizes woven wire mesh in strip form for the spirally wrapped strip 36, as illustrated in FIG. 4. The appended claims are intended to cover and embrace any such modifications within the limits only of the true spirit and scope of the invention.

What is claimed is:

1. In an equipment enclosure including an opening therein, a separable door covering the opening and an electromagnetic interference shield coextensive with the enclosure, an improved gasket disposed about the opening at a junction of the door with the enclosure bridging discontinuities of the shielding at the junction when the door is in a closed position, said gasket being of the type having a magnetic element attractive to the enclosure, wherein the improved gasket comprises:
  A. a laminar strip including
    1. a plastic magnetic strip having first and second opposite faces, and
    2. a foam strip having first and second opposite faces and a width essentially equal to the width of said magnetic strip, the first face of said magnetic strip coextensively abutting the second face of said foam strip; and
  B. a pliable conductive strip wrapped spirally about said laminar strip and forming coils abutting the first face of said foam strip and the second face of said magnetic strip, said foam strip compressed between said magnetic strip and said coils partially with respect to the thickness of said foam strip and uniformly with respect to the length of said foam strip, adjacent ones of the coils of said spirally wrapped strip abutting the second face of said magnetic strip separated from each other leaving portions of said second face of said magnetic strip therebetween exposed for physical contact with the shielding, said conductive strip holding said foam strip to said magnetic strip.

2. The improved gasket as claimed in claim 1, wherein the thickness of said compressed foam strip is ⅔ to ⅓ the uncompressed thickness of said foam strip.

3. In an equipment enclosure having an electromagnetic interference shield coextensive therewith, an opening in the enclosure, and a separable closure covering the opening, an improved gasket disposed about the opening at a junction of the closure with the enclosure bridging discontinuities of the shielding at the junction when the closure is in a closed position, said gasket being of the type having a magnetic element attractive to the enclosure, wherein the improved gasket comprises:
  A. a laminar strip including
   1. a resilient magnetic strip having first and second opposite faces,
   2. a foam strip having first and second opposite faces and a width essentially equal to the width of said magnetic strip, the first face of said magnetic strip coextensively abutting the second face of said foam strip,
   3. a first pliable conductive strip having first and second opposite surfaces and a width essentially equal to the width of said magnetic strip, said second surface coextensively abutting the first face of said foam strip; and
  B. a second pliable conductive strip wrapped spirally about said laminar strip and forming coils abutting said first surface and said second face of said magnetic strip, said foam strip partially compressed between said magnetic strip and said first conductive strip by the coils of said second conductive strip, adjacent ones of the coils of said spirally wrapped strip abutting the second face of said magnetic strip separated from each other leaving portions of said second face of said magnetic strip exposed.

4. In an equipment enclosure having an electromagnetic interference shield coextensive therewith, an opening in the enclosure, and a separable closure covering the opening, an improved gasket disposed about the opening at a junction of the closure with the enclosure bridging discontinuities of the shielding at the junction when the closure is in a closed position, said gasket being of the type having a magnetic element attractive to the enclosure, wherein said improved gasket comprises:
  a laminar strip including
   a pliable magnetic strip,
   a foam strip bonded on one side thereof to said magnetic strip,
   a first conductive strip disposed on and bonded to only the side of said foam strip opposite said one side; and
  a pliable conductive strip wrapped spirally about said laminar strip, said foam strip compressed partially with respect to the thickness thereof and uniformly with respect to the length thereof between said magnetic strip and said first conductive strip by said wrapped conductive strip.

* * * * *